United States Patent
Caunegre

(10) Patent No.: US 8,589,856 B2
(45) Date of Patent: Nov. 19, 2013

(54) INTEGRATED CIRCUIT DESIGN TOOL APPARATUS AND METHOD OF DESIGNING AN INTEGRATED CIRCUIT

(75) Inventor: Pascal Caunegre, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/577,937

(22) PCT Filed: Feb. 16, 2010

(86) PCT No.: PCT/IB2010/000618
§ 371 (c)(1),
(2), (4) Date: Aug. 9, 2012

(87) PCT Pub. No.: WO2011/101698
PCT Pub. Date: Aug. 25, 2011

(65) Prior Publication Data
US 2012/0317532 A1   Dec. 13, 2012

(51) Int. Cl.
*G06F 17/50* (2006.01)
(52) U.S. Cl.
USPC .......................................... 716/136; 716/106
(58) Field of Classification Search
USPC .................. 716/136–139, 106–108
See application file for complete search history.

(56) References Cited

U.S. PATENT DOCUMENTS

| | | | |
|---|---|---|---|
| 7,089,512 B2 | 8/2006 | Iadanza et al. | |
| 7,089,513 B2 | 8/2006 | Bard et al. | |
| 8,271,910 B2 * | 9/2012 | Tirapu-Azpiroz et al. | 716/54 |
| 8,336,005 B2 * | 12/2012 | Taguchi et al. | 716/54 |
| 2003/0131334 A1 | 7/2003 | Suaya et al. | |
| 2009/0113370 A1 | 4/2009 | Yoshinaga | |
| 2011/0307845 A1 * | 12/2011 | Taguchi et al. | 716/55 |

OTHER PUBLICATIONS

International Search Report and Written Opinion correlating to PCT/IB2010/000618 dated Nov. 25, 2010.

* cited by examiner

*Primary Examiner* — Binh Tat

(57) ABSTRACT

An integrated circuit design tool apparatus including a processing resource arranged to support a circuit simulator, a circuit simulator interrogator, and a well distance calculator is provided. The circuit simulator interrogator communicates first and second well distance values separately to the circuit simulator and receives first and second performance parameter value back from the circuit simulator interrogator in response. The well distance calculator determines a performance parameter limit value, and projects, substantially linearly, a well distance change value in respect of the performance parameter limit value using the first and second performance parameter values, the performance parameter limit value and a trial well distance change value. Also, a well distance change characterizing equation using the well distance change value projected is used in order to obtain the minimum well distance value associated with the performance parameter limit value.

19 Claims, 2 Drawing Sheets

INTEGRATED CIRCUIT DESIGN TOOL APPARATUS AND METHOD OF DESIGNING AN INTEGRATED CIRCUIT

FIELD OF THE INVENTION

This invention relates to an integrated circuit design tool apparatus of the type that, for example, minimises a well distance in respect of a semiconductor device. This invention also relates to a method of designing an integrated circuit, the method being of the type that, for example, minimises a well distance in respect of a semiconductor device design.

BACKGROUND OF THE INVENTION

In the field of semiconductor device design, it is well known to fabricate switching devices, for example, transistors, on silicon (Si) or other semiconductor materials. It is also known to form wells in the silicon by implanting ions of another element. Indeed, so called high energy ion implanters are known for forming relatively heavily doped n-wells and p-wells. It is also known to form deep buried wells using ion implanters.

Typically, the implanted regions are formed in a well-known manner by depositing photoresist on a surface of a semiconductor material, the photoresist forming a pattern such that the photoresist exposes selected regions of the surface of the semiconductor material so that ions expelled from the ion implanter can reach the surface of the semiconductor material and implantation of the ions can take place.

In this connection, a so-called "well proximity effect" is known to exist, whereby the operational performance, for example threshold voltage and drain current, of a transistor is affected by proximity of formation of the source or drain of the transistor to a well edge. The influence of the well edge parameter is understood to be caused by ions scattering from the edges of the photoresist, which become implanted in the surface of the exposed semiconductor material, thereby resulting in excess dopant near the border of the well and the photoresist: the "well edge". Generally in line with Moore's law, the law that describes the long-term trend relating to the number of transistors that can be formed in an integrated circuit, the size of transistors being formed is decreasing and it has been found that the impact of the well effect is increasing as a consequence thereof.

Design engineers, mindful of the well proximity effect, therefore take precautions to obviate or at least mitigate the well proximity effect. In some instances, the design process involves making a conservative estimate of a safe distance from the well edge, or guard band, such that performance of devices formed outside the guard band are not affected by the well proximity effect. However, use of conservatively estimated guard bands results in transistors being formed further from the well edge than is necessary, a consequential result being that silicon "real estate" is unnecessarily wasted.

When designing integrated circuits, it is important to possess accurate models of transistors for electronic circuit simulation. To this end, for Metal Oxide Semiconductor Field Effect Transistors (MOSFETs), it is known to use the so-called Berkeley Short-channel IGFET (Insulated Gate Field Effect Transistor) Model (BSIM), which characterises performance as a function of well distance, as described in Chapter 14 of the BSIM4.5.0 Manual available from University of California, Berkeley. Using the modelling information provided in this manual enables the safe well distance to be calculated with greater accuracy, thereby avoiding the need to estimate the guard band as mentioned above.

In such an implementation, the model described in the BSIM4.5.0 Manual is used in conjunction with a so-called "Optimiser" and a circuit simulator, for example Simulation Program with Integrated Circuit Emphasis (SPICE). In this respect, the Optimiser makes iterative changes to design parameters of an integrated circuit being designed and each iteration of the circuit design is passed to the circuit simulator for, inter alia, calculation of performance parameters of transistors, the results of the circuit simulation being passed back to the Optimiser for analysis and are used to guide generation of a subsequent iteration of the design parameters of the integrated circuit. In this regard, the Optimiser can iteratively change well distances iteratively until optimum well distances are determined.

The use of the Optimiser in conjunction with the circuit simulator is time consuming due to the number of iterations that need to be performed and the large number of parameters that potentially can be altered before an optimum solution can be found. As will be appreciated by the skilled person, such a solution is computationally complex, and the time consuming nature of the technique, contributes considerably to the fiscal cost of designing the integrated circuit.

An alternative solution is described in U.S. Pat. No. 7,089,513, which relates to a system that checks signal integrity (noise) of an integrated circuit design and changes edge distances of a Field Effect Transistor iteratively until signal integrity criteria are met. However, the system of U.S. Pat. No. 7,089,512 is limited to signal integrity performance and is also an iterative process that is still computationally expensive as explained above.

SUMMARY OF THE INVENTION

The present invention provides an integrated circuit design tool apparatus and a method of designing an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
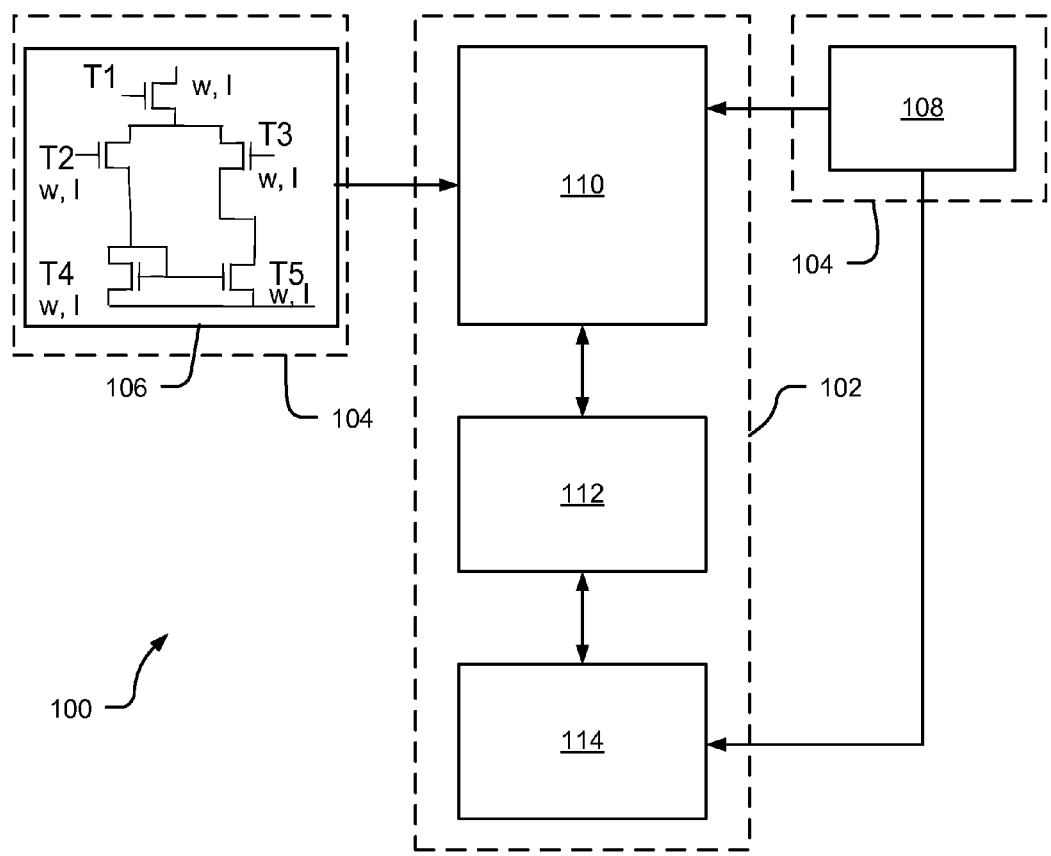
FIG. 1 is a schematic diagram of an integrated circuit design tool apparatus constituting an embodiment of the invention.

Referring now to FIG. 1, an integrated circuit design tool apparatus 100 comprises a processing resource, for example a processor 102 of a Personal Computer (PC) or other computing apparatus and a storage device, for example a memory of the PC, such as a digital memory 104, for storing integrated circuit design data 106. In this example, the design data 106 comprises electrical schematic data defining, for example, interconnections between devices, such as MOSFETS, capacitors and resistors, and layout data, for example information concerning the various layers of semiconductor material from which an integrated circuit is formed. The memory 104 is operably coupled to the processor 102. The memory 104 also stores device model data 108 associated with a model for a semiconductor device, more details of which will be described later herein.

The processor 102 supports a circuit simulator 110, for example the known SPICE circuit simulator. However, the skilled person should appreciate that other circuit simulators can be employed. The circuit simulator 110 is capable of accessing the integrated circuit design data 106 and the device model data 108.

The circuit simulator 110 is operably coupled to a circuit simulator interrogator 112, the circuit simulator interrogator 112 being operably coupled to a well distance calculator 114. The well distance calculator 114 is also capable of accessing the device model data 108 stored by the memory 104. Although not shown, the processor 102 supports a user interface to allow a user, for example a design engineer, to provide the well distance calculator 114 with various input data to enable the well distance calculator 114 to determine a minimum well distance value ($sc_{min}$).

Figure 2:
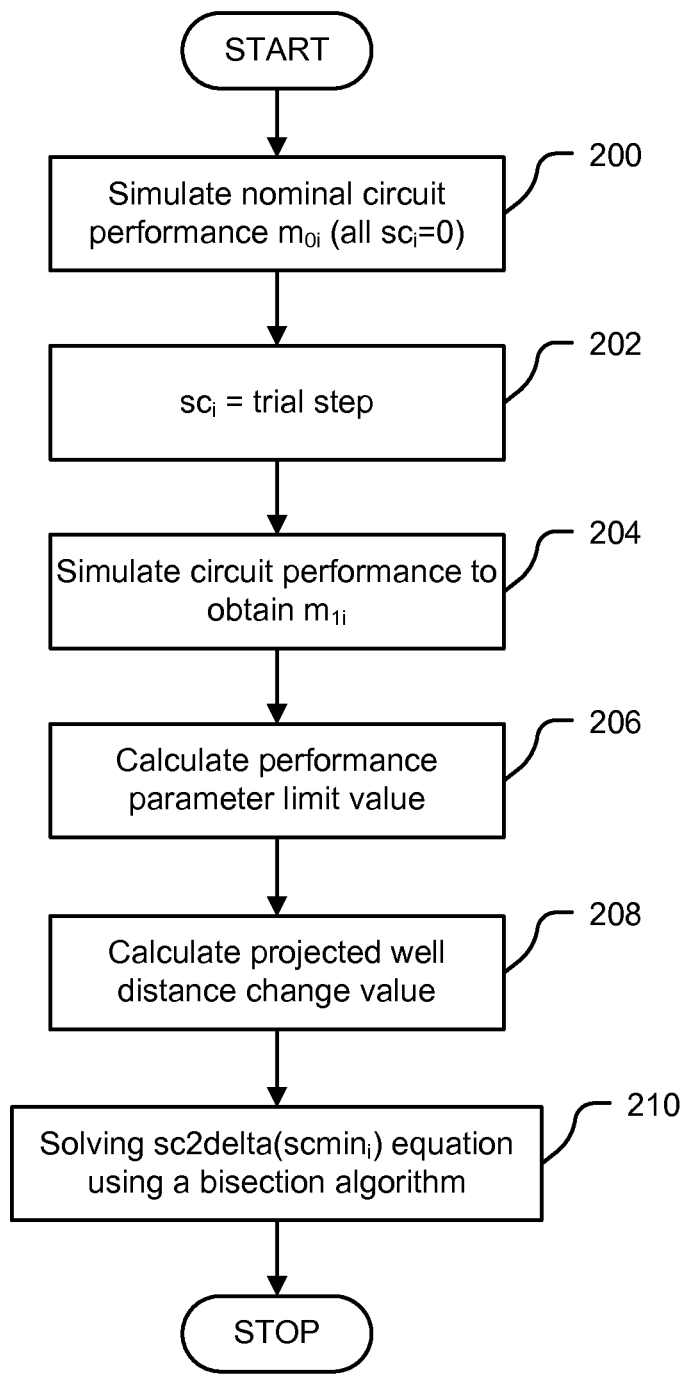
FIG. 2 is a flow diagram of a method of designing an integrated circuit used by the apparatus of FIG. 1.

In operation (FIG. 2), a user identifies to the well distance calculator 114, via the user interface, with a location of the integrated circuit design data 106 and a location of the device model data 108. In this example, integrated circuit design data 106 relates to a Metal Oxide Semiconductor (MOS) integrated circuit, in particular a MOS Field Effect Transistor (MOSFET) integrated circuit. The device model data 108 identified by the user is therefore MOSFET model data, for example Berkeley Short-Channel IGFET Model (BSIM), such as BSIM4.5.0 model data.

Figures 3, 4:
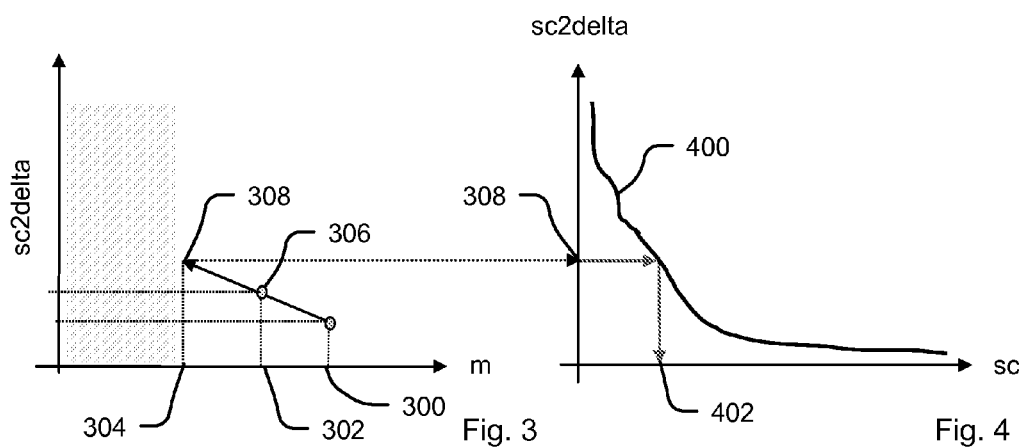
FIG. 3 is a graph of well proximity effect deviation factor vs. performance parameter.
FIG. 4 is a characteristic curve associated with a well proximity effect deviation factor characterisation equation.

The location of the integrated circuit design data 106 and the location of the device model data 108 are then communicated to the circuit simulator interrogator 112 for configuring the circuit simulator 110 so that the circuit simulator 110 is able to access the integrated circuit design data 106 and the device model data 108. Thereafter, the circuit simulator interrogator 112 communicates a first well distance value, $sc_o$, to the circuit simulator 110 for use in relation to each semiconductor device, in this example transistor, contained in the integrated circuit design data 106. Then, in respect of each transistor of the integrated circuit design, the circuit simulator 110 performs a circuit simulation and calculates (Step 200) a first performance parameter value, $m_0$, 300 (FIG. 3) associated with the first well distance value, $sc_0$.

In this respect, it should be appreciated that the first performance parameter value, $m_0$, 300 is in respect of one type of performance parameter, for example gain. However, it should be understood that the circuit simulation performed by the circuit simulator 10 also yields other first performance parameter values, $m_0'$, $m_0''$, . . . in respect of other types of performance parameter, for example bandwidth, frequency or rise time. However, at this point in the explanation of the embodiment and so as not to distract from the core teachings of the embodiment, reference will only be made to the first performance parameter value, $m_0$, until later herein. For each transistor, the circuit simulator interrogator 112 then selects (Step 202) a trial well distance, $sc_1$, for example an arbitrary increment, such as 1 μm. The circuit simulator interrogator 112 then communicates the trial well distance, $sc_1$, to the circuit simulator 110 and the circuit simulator 110 performs another circuit simulation and calculates (Step 204) a second performance parameter value, $m_1$, 302 associated with the second well distance value, $sc_1$. Again, in a like manner to the first performance parameter value, $m_0$, 300, other second performance parameter values, $m_1'$, $m_2'$, . . . are also calculated by the circuit simulator 110 when calculating the second performance parameter value, $m_i$, 302. However, again, reference will only be made to the second performance parameter value, $m_i$, 302 in relation to this embodiment for the reasons already stated above.

For the avoidance of doubt, the skilled person should appreciate the determination of the first and second performance parameters for each type of performance parameter is achieved by respective first and second "runs" of the circuit simulator 110.

Thereafter, the well distance calculator 114 calculates (Step 206), for each transistor, a performance parameter limit value, $m_i$, 304 by scaling the respective first performance parameter values, $m_0$. In this example, a lower maximum permitted deviation, for example of about 1% less than the first performance parameter value, $m_0$, is calculated, but for other parameters, higher scale factor can be employed, for example about 1% above the first performance parameter values, $m_0$. In this respect, the well distance calculator 114 applies a lower maximum deviation or a higher maximum deviation depending upon the position of the second performance parameter value, $m_i$, relative to the first performance parameter value, $m_0$. Of course, the skilled person will appreciate that other scale factors can be employed to generate the performance limit values, $m_i$. In this example, however, the performance parameter limit value, $m_i$, for each transistor is calculated using the formula:

$$m_{li} = 0.99 * m_{0i} \quad (1)$$

It has been recognised that, for small variations in threshold voltage (the vth0 parameter in the BSIM model), performance parameter values vary linearly. This has also been found to be true in respect of small variations in the low-field mobility parameter (u0) and the second order body bias (k2) parameter. It has therefore been concluded that a well proximity effect deviation factor value, a component that mathematically influences the threshold voltage, the low-field mobility and the second order body bias, is also substantially linear over small distances and can be expressed as the following well proximity effect deviation factor characterisation equation:

$$sc2\text{delta} = SCA + web*SCB + wec*SCC \quad (2)$$

where SCA is a first instance parameter for a first distribution function for scattered well dopant, SCB is a second instance parameter for a second distribution function for scattered well dopant, SCC is a third instance parameter for a third distribution function for scattered well dopant, web is a first coefficient for the second instance parameter, SCB, and wec is a second coefficient for the third instance parameter, SCC. The first, second and third instance parameters, as well as the first and second coefficients are obtained from the device model data 108. The well proximity effect deviation factor characterisation equation, sc2delta, has a characteristic curve 400

(FIG. 4) associated therewith. According to the device model data, in this example the BSIM4.5.0 model, the first instance parameter, SCA, is defined, in terms of $SC_{ref}$ and $W_{drawn}$ by the following equation:

$$SCA = \frac{SC_{ref}^2}{W_{drawn}} \cdot \left( \frac{1}{SC} - \frac{1}{SC + W_{drawn}} \right) \quad (3)$$

Similarly, the second instance parameter, SCB, is defined, in terms of $SC_{ref}$ and $W_{drawn}$ by the following equation:

$$SCB = \frac{1}{W_{drawn} \cdot SC_{ref}} \quad (4)$$

$$\left( \begin{array}{c} \frac{SC_{ref}}{10} \cdot SC \cdot \exp\left(-10 \cdot \frac{SC}{SC_{ref}}\right) + \frac{SC_{ref}^2}{100} \exp\left(-10 \cdot \frac{SC}{SC_{ref}}\right) - \\ \frac{SC_{ref}}{10} \cdot (SC + W_{drawn}) \cdot \exp\left(-10 \cdot \frac{SC + W_{drawn}}{SC_{ref}}\right) - \\ \frac{SC_{ref}^2}{100} \exp\left(-10 \cdot \frac{SC + W_{drawn}}{SC_{ref}}\right) \end{array} \right)$$

Likewise, the third instance parameter, SCC, is defined, in terms of $SC_{ref}$ and $W_{drawn}$ by the following equation:

$$SCC = \frac{1}{W_{drawn} \cdot SC_{ref}} \quad (5)$$

$$\left( \begin{array}{c} \frac{SC_{ref}}{20} \cdot SC \cdot \exp\left(-20 \cdot \frac{SC}{SC_{ref}}\right) + \frac{SC_{ref}^2}{400} \exp\left(-20 \cdot \frac{SC}{SC_{ref}}\right) - \\ \frac{SC_{ref}}{20} \cdot (SC + W_{drawn}) \cdot \exp\left(-20 \cdot \frac{SC + W_{drawn}}{SC_{ref}}\right) - \\ \frac{SC_{ref}^2}{400} \exp\left(-20 \cdot \frac{SC + W_{drawn}}{SC_{ref}}\right) \end{array} \right)$$

Consequently, using equation (2) above, a trial well proximity effect deviation factor value sc2delta($sc_1$), 306 for each second well distance value, $sc_1$ (associated with the second performance parameter value, $m_1$, 302) can be calculated by the well distance calculator 114. In order to perform the calculations, the $SC_{ref}$, SCA, SCB, SCC, web and wec parameters are obtained from the device model data 108, and the $W_{draw}$ (=W) parameter is obtained from the integrated circuit design data 106.

Now, since it has been recognised that, over small distances, performance parameter values vary linearly, and so evaluations of the well proximity effect deviation factor value equation, sc2delta, also vary substantially linearly over small distances, a projected well proximity effect deviation factor value sc2delta($sc_{min}$) for an associated performance parameter limit value, $m_l$, can be calculated using the following linear equation:

$$sc2delta(sc_{min}) = \frac{(m_l - m_0)}{(m_1 - m_0)} sc2delta(sc_1) \quad (6)$$

Consequently, for each transistor, the well distance calculator 114 calculates (Step 208) the projected well proximity effect deviation factor value sc2delta($sc_{min}$), 308 using the first performance parameter values, $m_0$, the second performance parameter values, $m_1$, the performance value limit values, $m_l$, and the trial well proximity effect deviation factor values, sc2delta($sc_1$) for the second well distance values, $sc_1$.

Once the projected well proximity effect deviation factor value sc2delta($sc_{min}$) has been calculated for each transistor, the minimum well distance value, $sc_{min}$, is calculated (Step 210) using equation (2) above and the projected well proximity effect deviation factor value, sc2delta($sc_1$). In this respect, equation (2) is solved numerically, for example using root finding algorithm, such as a bisection method for solving equations. The well distance calculator 114 has therefore calculated, for each performance parameter limit value, $m_l$, the minimum well distance value, $sc_{min}$, 402 associated therewith.

As described above, the minimum well distance value, $sc_{min}$, has been calculated for each transistor. In this respect, it should be appreciated that the above calculation steps (Steps 206 to 210) are repeated for each transistor for the performance parameter being analysed. Furthermore, as explained above, a number of performance parameters exist for each semiconductor device, each performance parameter having a respective minimum well distance value associated therewith. Therefore, in another embodiment, the above described method is implemented such that the minimum well distance values, $sc_{min}$, $sc_{min}'$, $sc_{min}''$, ... are calculated for each transistor by the well distance calculator 114 in respect of each performance parameter of interest, for example gain, frequency, bandwidth, and/or rise-time. Consequently, for each transistor, the first performance parameter values, $m_0$, the second performance parameter values, $m_1$, and the projected well proximity effect deviation factor values, sc2delta($sc_1$) are used to generate a set of minimum well distance values, each minimum well distance value corresponding to a different type of performance parameter.

In order to ensure that account is taken of all operational parameters of interest, for a given semiconductor device, i.e. a given set of minimum well distance values, the well distance calculator 114 selects the largest of the minimum well distance values in each set, which constitutes the minimum well distance value, $sc_{min}$, to be used with the associated semiconductor device.

In another embodiment, the above described techniques can be optimised by modifying the manner in which the performance parameter limit value, $m_l$, is used. In this respect, for each transistor of the integrated circuit, the lower maximum or higher maximum permitted deviation selected is applied initially in the same manner already described above and the minimum well distance value, $sc_{min}$, is calculated by the well distance calculator 114 for each transistor. The minimum well distance calculator 114 then analyses the well distance values, $sc_{min}$, calculated in order to identify the minimum well distance values, $sc_{min}$, that are small, for example close to zero, such as less than 0.1 µm. It should, of course, be appreciated that the definition of "close" is technology dependent and will be determined to be a value that corresponds to a well distance change that does not influence the performance of a given transistor. Where a deviation is deemed to be close to zero, the transistor associated with the deviation is excluded from a re-calculation of minimum well distance values, $sc_{min}$, i.e. the above process of calculating the minimum well distance values, $sc_{min}$, is repeated in a like manner to that described above, but the minimum well distance values, $sc_{min}$, are only calculated for transistors where a change in the well distance affects one or more operational parameters of the transistor. In this respect, the lower maximum or higher maximum permitted deviation selected is divided between the remaining transistors in respect of which the respective minimum well distance values are to be calculated. In order to appreciate this concept further, it should be understood that the performance parameter limit value for each transistor, for which the minimum well distance value has to be calculated can be represented by the following equation:

$$m_{li} = \left(1 - \frac{d}{100 \cdot n}\right) \cdot m_{0i}$$

where $m_{li}$, is the performance parameter limit value for an $i^{th}$ transistor, d is an overall maximum permitted deviation for the transistors requiring respective minimum well distance values to be calculated, n is the number of transistors requiring the minimum well distance value to be calculated, an $m_{0i}$ is the first performance parameter value obtained from the circuit simulator 110 for the $i^{th}$ transistor.

It is thus possible to provide an integrated circuit design tool apparatus and a method of designing an integrated circuit that enables well distances to be calculated in respect of semiconductor devices in an integrated circuit layout in less time than existing techniques requiring iterative references to a circuit simulator, for example up to 10 times faster. Consequently, design time for an integrated circuit is reduced. Furthermore, semiconductor "real estate" is not unnecessarily wasted by use of overly conservative estimates of well distances.

Of course, the above advantages are exemplary, and these or other advantages may be achieved by the invention. Further, the skilled person will appreciate that not all advantages stated above are necessarily achieved by embodiments described herein.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

In this respect, it should be appreciated that although the above examples have been described in the context of well distances the above technique can be applied to other dimensional values associated with a semiconductor device, for example a device width, where a deviation factor characterisation equation can be determined and trial deviation factor values can be calculated. Of course, it should be further appreciated that a change in the dimensional value should affect a performance parameter of the semiconductor device.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, circuit simulator interrogator 112 can be combined with the well distance calculator 114.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An integrated circuit design tool apparatus for determining a minimum dimensional value for a dimension of a semiconductor device and in respect of a performance parameter, the apparatus comprising:
    a processing resource arranged to support a circuit simulator capable of communicating with a circuit simulator interrogator, and a well distance calculator; wherein
        the circuit simulator interrogator is arranged to communicate a first dimensional value to the circuit simulator and the circuit simulator is arranged to communicate a first performance parameter value to the circuit simulator interrogator in response to the first dimensional value, and
        the circuit simulator interrogator also being arranged to communicate a second dimensional value to the circuit simulator and the circuit simulator also being arranged to communicate a second performance parameter value to the circuit simulator interrogator in response to the second dimensional value;
    the well distance calculator is arranged to determine a performance parameter limit value, and to project substantially linearly a deviation factor value for the dimension in respect of the performance parameter limit value using the first performance parameter value, the second performance parameter value, the performance parameter limit value, and a trial deviation value for the dimension; and
    the well distance calculator is also arranged to solve a deviation factor characterisation equation for the dimension using the deviation factor value projected in order to obtain the minimum dimensional value associated with the performance parameter limit value.

2. An apparatus as claimed in claim 1, wherein the well distance calculator is arranged to solve the deviation factor characterisation equation using a numerical algorithm for solving equations.

3. An apparatus as claimed in claim 1, wherein the well distance calculator is arranged to solve the deviation factor characterisation equation using a root-finding algorithm.

4. An apparatus as claimed in claim 1, wherein the well distance calculator is arranged to solve the deviation factor characterisation equation using a bisection method for solving equations.

5. An apparatus as claimed claim 1, wherein the well distance calculator is arranged to calculate the trial deviation factor value.

6. An apparatus as claimed in claim 5, wherein the trial deviation factor value is calculated in respect of the second dimensional value.

7. An apparatus as claimed in claim 1, wherein the circuit simulator is arranged to simulate performance of a semiconductor device.

8. An apparatus as claimed in claim 7, wherein the semiconductor device is a transistor device.

9. An apparatus as claimed in claim 7, wherein the well distance calculator is arranged to calculate the minimum dimensional value in respect of the semiconductor device.

10. An apparatus as claimed in claim 1, wherein the deviation factor characterisation equation is associated with a semiconductor device model.

11. An apparatus as claimed in claim 1, wherein the deviation factor characterisation equation is a function of a first instance parameter, a second instance parameter and a first coefficient therefor, a third instance parameter and a second coefficient therefor.

12. An apparatus as claimed in claim 1, wherein the deviation factor characterising equation, sc2delta, is:

$$sc2\text{delta} = sca + web*scb + wec*scc$$

where:
    sca is a first instance parameter for a first distribution function for scattered well dopant,
    scb is a second instance parameter for a second distribution function for scattered well dopant,
    scc is a third instance parameter for a third distribution function for scattered well dopant,
    web is a first coefficient for the second instance parameter, scb, and
    wec is a second coefficient for the third instance parameter, scc.

13. An apparatus as claimed in claim 1, wherein the projected deviation factor value, sc2delta, in respect of the minimum dimensional value is calculated using the following equation:

$$sc2\text{delta}(sc_{min}) = \frac{(m_l - m_0)}{(m_1 - m_0)} sc2\text{delta}(sc_1)$$

where:
    m0 is the first performance parameter value,
    m1 is the second performance parameter value,
    ml is the performance parameter limit value,
    sc1 is the second dimensional value, and
    sc2delta is the calculated trial deviation factor value in respect of the second dimensional value, sc1.

14. An apparatus as claimed in claim 1, wherein the well distance calculator is arranged to calculate the performance parameter limit value by scaling the first performance parameter value.

15. An apparatus as claimed in claim 1, wherein in respect of another performance parameter of the semiconductor device:
- the circuit simulator is also arranged to communicate another first performance parameter value and another second performance parameter value to the circuit simulator interrogator in response to receipt of the first dimensional value and the second dimensional value, respectively;
- the well distance calculator is arranged to determine another performance parameter limit value, and to project substantially linearly another deviation factor value in respect of the another performance parameter limit value using the another first performance parameter value, the another second performance parameter value, the another performance parameter limit value, and another trial deviation factor value; and
- the well distance calculator is also arranged to solve the deviation factor characterisation equation using the another deviation factor value projected in order to obtain another minimum dimensional value associated with the another performance parameter limit value.

16. An apparatus as claimed in claim 15, wherein the well distance calculator is arranged to select a largest of the minimum dimensional value and the another minimum dimensional value.

17. An apparatus as claimed in claim 1, further comprising:
- integrated circuit design data defining a first semiconductor device and a second semiconductor device; wherein the circuit simulator, the circuit simulator interrogator, and the dimensional calculator are arranged to calculate a first device minimum well distance value in respect of the first semiconductor device and to calculate a second device minimum dimensional value in respect of the second semiconductor device.

18. An apparatus as claimed in claim 1, wherein the first dimensional value is a first well distance value, the second dimensional value is a second well distance value, the deviation factor value is a well proximity effect deviation factor value, the trial deviation factor value is a trial well proximity effect deviation factor value, and the deviation factor characterisation equation is a well proximity effect deviation factor characterisation equation.

19. A method of designing an integrated circuit, the method comprising:
- a circuit simulator, by computer, calculating a first performance parameter value in response to receiving a first dimensional value for a dimension of a semiconductor device;
- the circuit simulator calculating a second performance parameter value in response to receiving a second dimensional value;
- a well distance calculator determining a performance parameter limit value, and projecting substantially linearly a deviation factor value in respect of the performance parameter limit value using the first performance parameter value, the second performance parameter value, the performance parameter limit value, and a trial deviation factor value; and
- the well distance calculator solving a deviation factor characterisation equation using the deviation factor value projected in order to obtain a minimum dimensional value for the dimension of the semiconductor device, the minimum dimensional value being associated with the performance parameter limit value.

* * * * *